(12) United States Patent
Phelan et al.

(10) Patent No.: US 8,353,489 B2
(45) Date of Patent: Jan. 15, 2013

(54) MOUNTING KIT

(75) Inventors: Andrew James Phelan, Magnolia, TX (US); Kelly K. Smith, Spring, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 212 days.

(21) Appl. No.: 12/886,749

(22) Filed: Sep. 21, 2010

(65) Prior Publication Data

US 2012/0068031 A1     Mar. 22, 2012

(51) Int. Cl.
*F16M 11/00* (2006.01)
(52) U.S. Cl. .................................................... 248/127
(58) Field of Classification Search ............... 248/127, 248/224.8, 220.21, 146; 211/26; 312/265.4; 29/525.01
See application file for complete search history.

(56) References Cited

U.S. PATENT DOCUMENTS

| | | | |
|---|---|---|---|
| 5,588,729 A * | 12/1996 | Berger | 312/334.4 |
| 6,891,727 B2 | 5/2005 | Dittus et al. | |
| 6,929,336 B2 | 8/2005 | Liu et al. | |
| 2005/0218091 A1 | 10/2005 | Westphall | |
| 2006/0121421 A1 | 6/2006 | Spitaels et al. | |
| 2012/0062083 A1* | 3/2012 | Lewis et al. | 312/223.1 |
| 2012/0106079 A1* | 5/2012 | Gomez | 361/679.58 |
| 2012/0120578 A1* | 5/2012 | Henderson et al. | 361/679.02 |
| 2012/0145657 A1* | 6/2012 | Krummell | 211/49.1 |

\* cited by examiner

*Primary Examiner* — Ramon Ramirez

(57) ABSTRACT

An embodiment of a mounting kit has first and second rails connectable to a frame and first and second spacers respectively connectable to the first and second rails. The first and second spacers are configured to engage an object therebetween when the first and second rails are connected to the frame. The first and second rails each comprise a portion configured to extend under the object when the object is between the first and second spacers. A distance from the first spacer to an end of the first rail and a distance from the second spacer to an end of the second rail are based on a length of the object.

20 Claims, 12 Drawing Sheets

MOUNTING KIT

BACKGROUND

Electronic components, such as servers and/or switches, may be located in a rack that may be enclosed within a cabinet so that the electronic components are accessible via a door of the cabinet. Inputs and outputs of the electronic components may be coupled to cables that may be routed between the components and the door. To provide a space between the door and the components for the cables, the electronic components may be recessed into the rack away from the door.

DETAILED DESCRIPTION

In the following detailed description of the present embodiments, reference is made to the accompanying drawings that form a part hereof, and in which is shown by way of illustration specific embodiments of the disclosure which may be practiced. These embodiments are described in sufficient detail to enable those skilled in the art to practice the subject matter of the disclosure, and it is to be understood that other embodiments may be utilized and that mechanical changes may be made without departing from the scope of the present disclosure. The following detailed description is, therefore, not to be taken in a limiting sense.

Figure 1A:
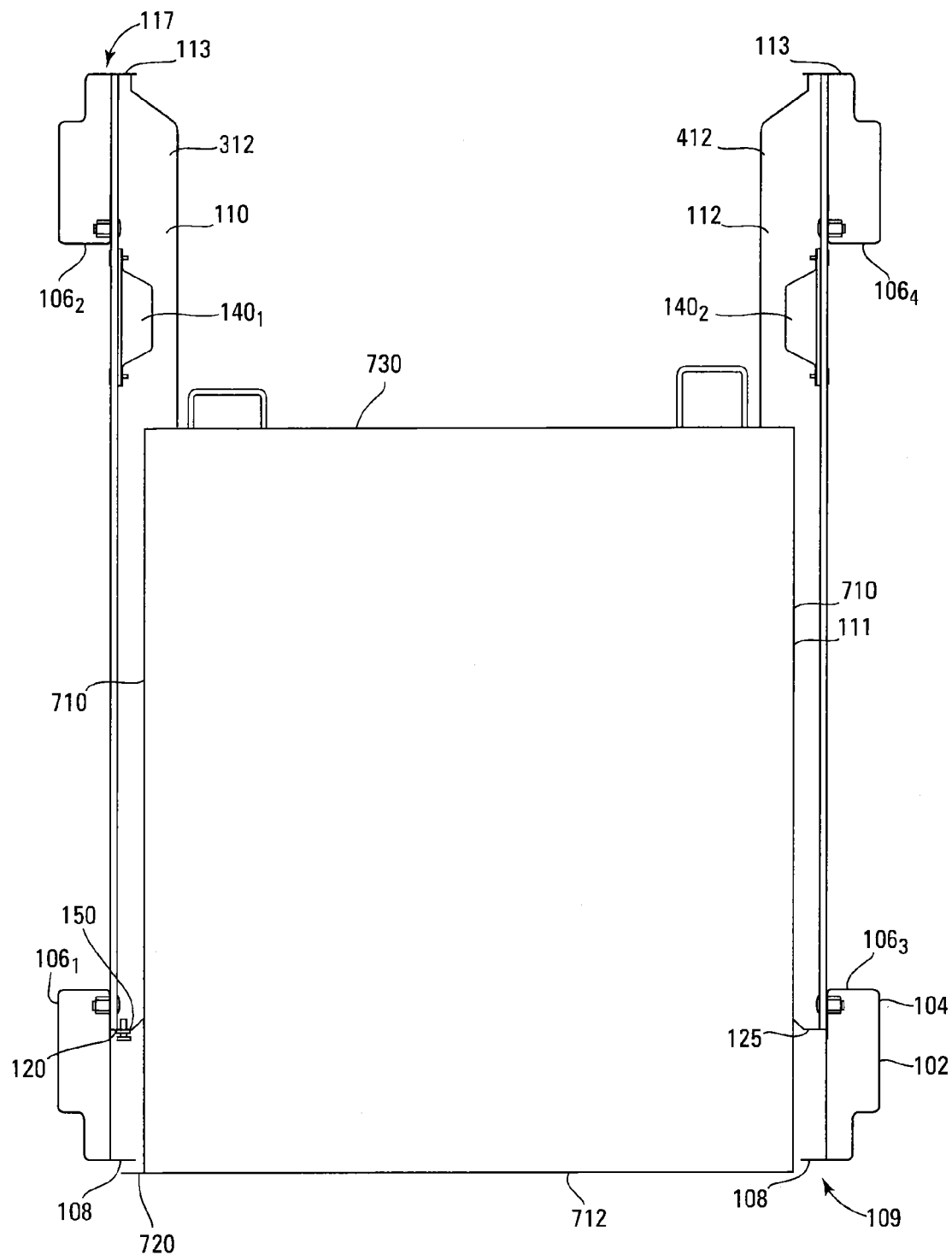
FIGS. 1A-1C are top views respectively showing different positions of an object as the object is being mounted in a rack using an embodiment of a mounting kit, according to an embodiment.
Figure 1B:
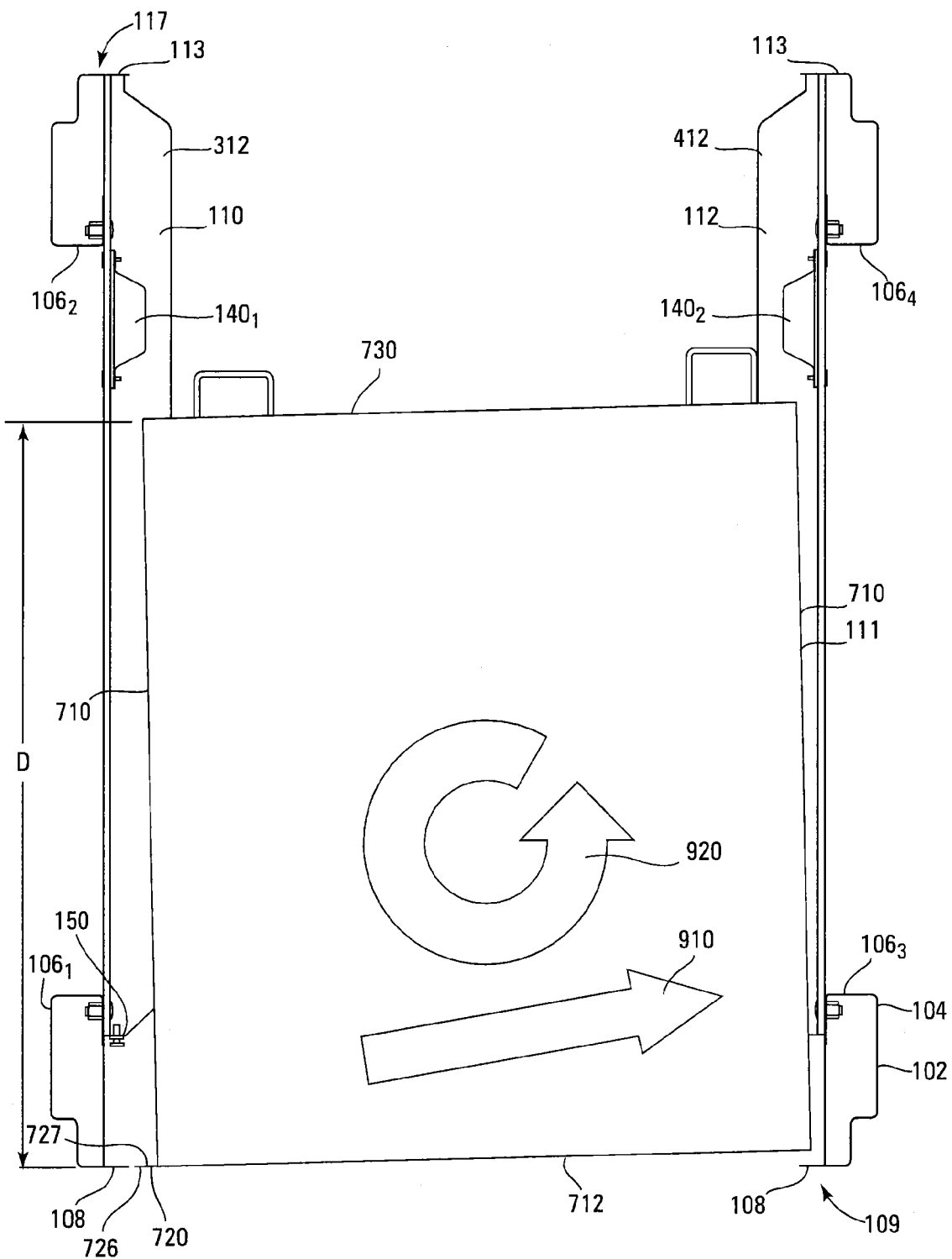
Figure 1C:
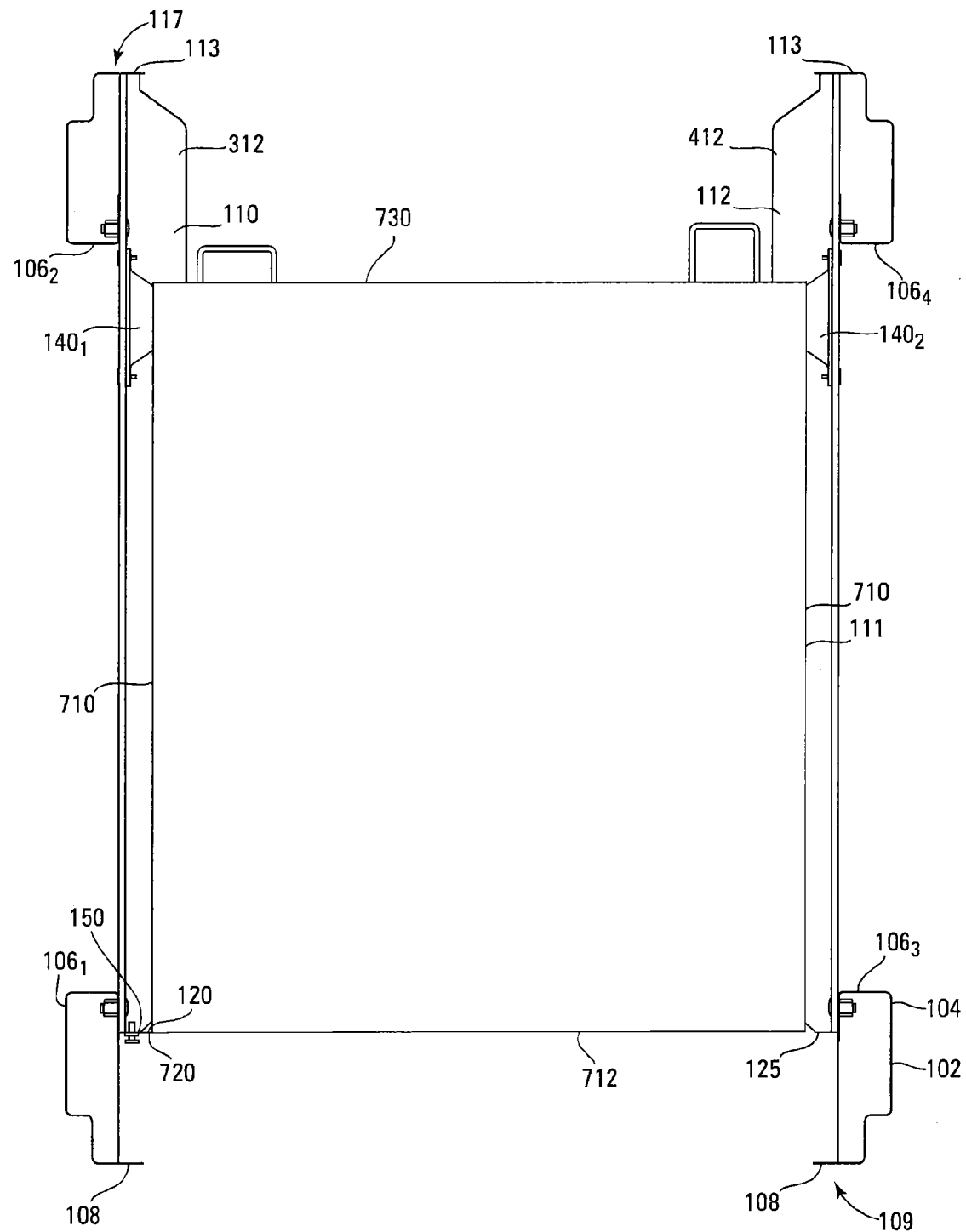

FIGS. 1A-1C are top views of a rack 102 configured, using an embodiment mounting kit, for recess mounting an object therein in accordance with various embodiments. For example, rack 102 may be electronics rack, such as a server rack, and the object may be an electronic component, such as a server switch 111. FIGS. 1A-1C respectively show different positions of switch 111 as it being mounted in rack 102 using the mounting kit.

In FIG. 1A, switch 111 is positioned so that a connector 720 extending from a sidewall (e.g., a side) 710 of switch 111 extends in front of rack 102. That is, connector 720 is just about to reach the surface 108, e.g., at the left of front 109 of rack 102. Whenever used herein, left and right and front and back refer to relative placements in the frames of reference of the figures and do not require any particular absolute orientation.

Connector 720 may be one of two or more connectors 720 that may be provided with switch 111. For example, in the prior art, connectors, such as connectors 720, may be respectively attached to the opposing sidewalls 710 of switch 111 so as to extend from the opposing sidewalls 710. In the prior art, the connectors may respectively attach to the surfaces 108 at the left and right of the front 109 of rack 102 so that the front surface 712 of switch 111 lies substantially in a plane corresponding to the front 109 of rack 102, e.g., providing little clearance for any cables to be routed between the front of switch 111 and a door of an enclosure that may contain rack 102.

In order to at least provide clearance for routing cables in front of switch 111, it is desired to recess the front 712 of switch inward from the front 109 of rack 102 using the mounting kit. For example, the mounting kit may include a rail 110 connected to one side (e.g., the left side) of rack 102 so that an end 120 of rail 110 is recessed inward from the front 109 of rack 102, as shown in FIG. 1A. The mounting kit may further include a rail 112 connected to the opposite side (e.g., the right side) of rack 102 so that an end 125 of rail 112 is recessed inward from the front 109 of rack 102, as shown in FIG. 1A.

Recessing the end 120, according to some embodiments, allows for recessed mounting of switch 111 within rack 102. For example, after inserting switch 111 in rack 102, as shown in FIGS. 1A-1C, for some embodiments, connector 720 may be connected to end 120 of rail 110, thereby recessing switch 111 in rack 102.

Attaching a connector 720 to both sidewalls, as is sometimes done in the prior art, acts to substantially prevent one, or both, of the connectors 720 from moving past the surfaces 108 at the front 109 of rack 102, thereby substantially preventing recessed mounting of switch 111. For example, the two connectors 720 may not be able to clear the surfaces 108. As such, for some embodiments, only one connector 720 may be connected to switch 111, as shown in FIG. 1A.

Switch 111 is moved into rack 102 until connector 720 reaches the surface 108 at the left of front 109. When connector 720 reaches that surface 108, switch 111 is rotated away from the left side of rack 102 in the direction of arrow 920, as shown in FIG. 1B, so that connector 720 clears the surface 108 at the left of front 109.

After connector 720 clears the surface 108 at the left of front 109, switch 111 may be rotated in a direction substantially opposite to the direction of arrow 920 back toward the left side of rack 102, so as to be substantially parallel with rails 110 and 112. Switch 111 may then be moved, e.g., over portions 312 and 412 of rails 110 and 112, toward the back 117 of rack 102 so that switch 111 passes between spacers 140₁ and 140₂ of the mounting kit and connector 720 contacts end 120 of rail 110, at which point the front 712 of switch 111 is recessed inward from the front 109 of rack 102, as shown in FIG. 1C. Connector 720 may then be fastened to end 120 of rail 110. Attaching only one connector 720 to switch 111, advantageously allows that connector 720 to clear rack 102 when switch is rotated, as shown in FIG. 1B, allowing switch 111 to be recessed from the front 109 of rack 102.

Embodiments the mounting kit disclosed herein allow conventional mounting racks, such as rack 102, to be configured for recess mounting objects, such as switch 111, therein. For example, spacers 140 of the mounting kit may engage sidewalls 710 of switch 111 therebetween, acting to substantially prevent (e.g., to prevent) switch 111 from moving from side to side within rack 102 and acting, at least partially, to compensate for using only one connector 720 to connect switch 111 to rail 110 and thus rack 102. Portions 312 and 412 respectively of rails 110 and 112 act to substantially prevent (e.g., to prevent) switch 111 from moving vertically downward within rack 102 and act, at least partially, to compensate for using only one connector 720 to connect switch 111 to rack 102. Connector 720 acts to substantially prevent (e.g., to prevent) switch 111 from moving from front to back with in rack 102.

For some embodiments, the distance from spacer $140_1$ to end 120 of rail 110 and the distance from spacer $140_2$ to end 125 of rail 112 may be based on the length of switch 111, e.g., defined as the distance from the front 712 to the back 730 of switch 111. Basing the distances of spacers 140 from the ends of rails 110 and 112 advantageously allows switch 111 to be rotated, as shown in FIG. 1B, for clearing rack 102. For example, if spacers $140_1$ and $140_2$ are too close to the ends of rails 110 and 112, switch 111 would engage spacers $140_1$ and $140_2$ before connector 720 reaches the front 109 of rack 102, substantially preventing switch 111 from being rotated. This would substantially prevent connector 720 from clearing rack 102, thereby substantially preventing switch 111 from being recess mounted.

Figure 2:
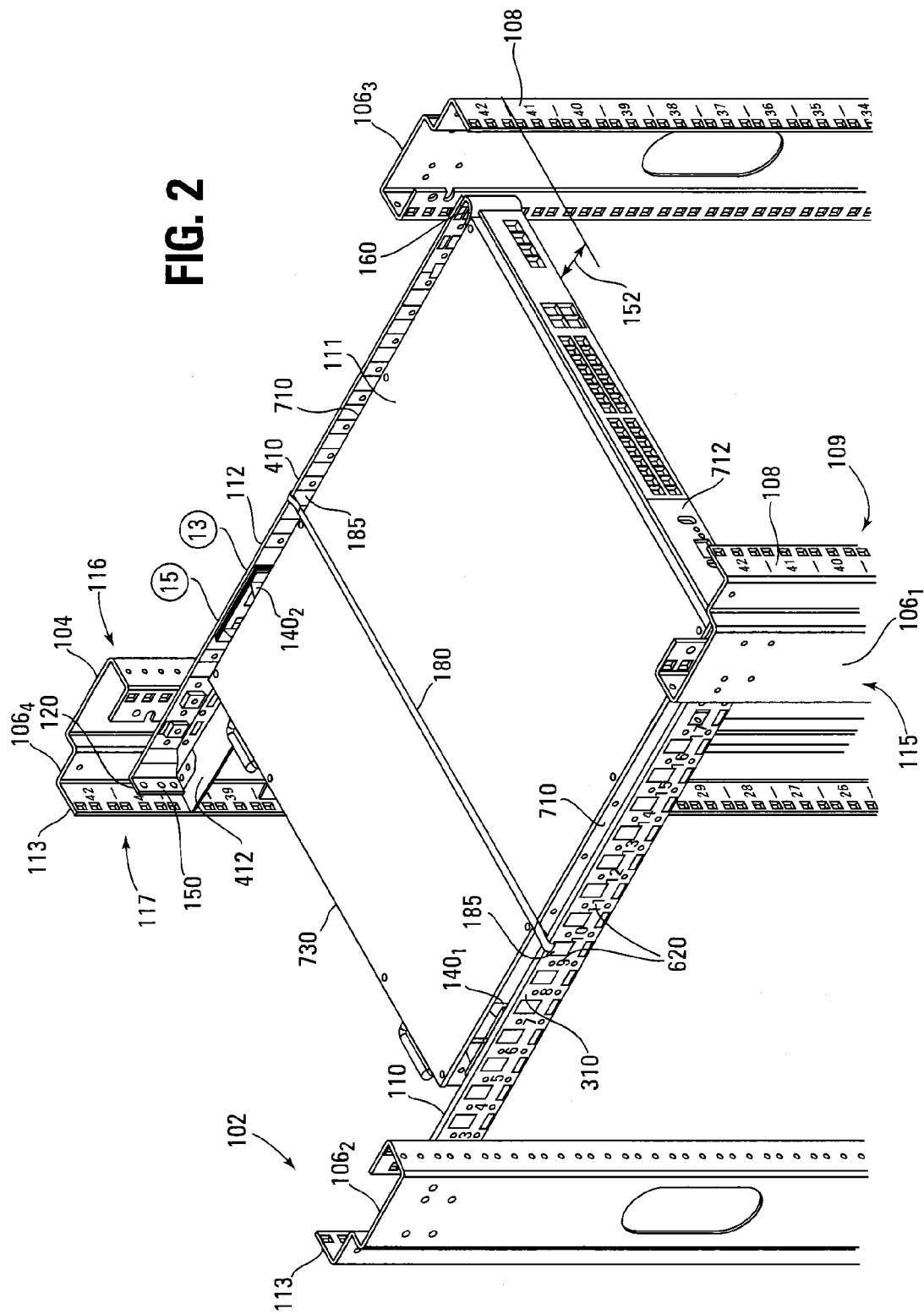
FIG. 2 illustrates an object mounted in a rack using an embodiment of a mounting kit, according to another embodiment.

FIG. 2 further illustrates rack 102. Rack 102 may include a frame 104 that may include a plurality (e.g., four) columns (e.g., posts) 106, e.g., front columns $106_1$ and $106_3$ located at the front of frame 104 and back columns $106_2$ and $106_4$ located at the back of the frame. Front surfaces 108 respectively of front columns $106_1$ and $106_3$ may lie substantially in a plane that defines a front 109 of frame 104, and thus of rack 102, and back surfaces 113 respectively of back columns $106_2$ and $106_4$ may lie substantially in a plane that defines a back 117 of frame 104 and thus of rack 102. Rack 102 may be enclosed in an enclosure (not shown), such as a cabinet, that may have a door (not shown) adjacent to the front 109 of rack 102.

Figure 3:
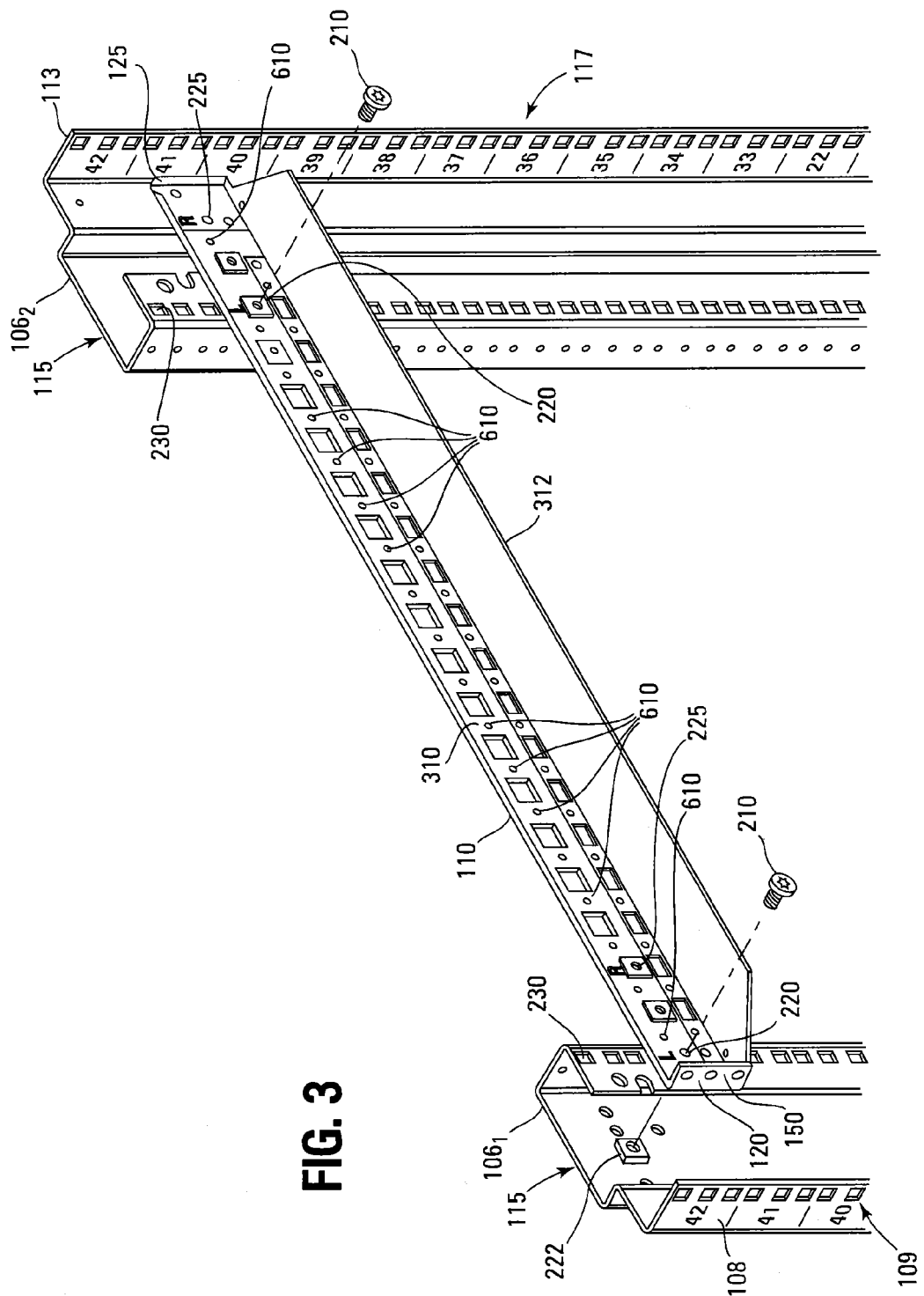
FIG. 3 illustrates an embodiment of rail of a mounting kit attached to a rack, according to another embodiment.
Figure 4:
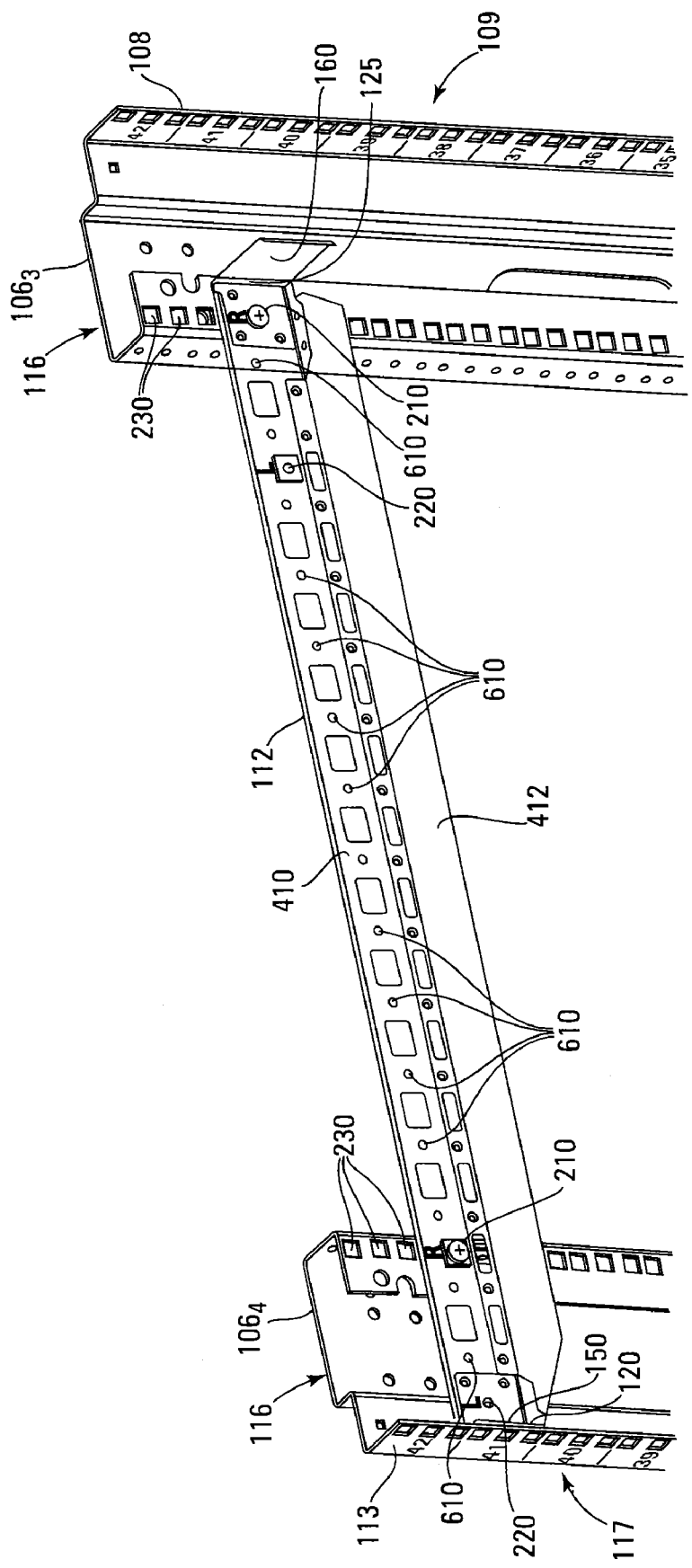
FIG. 4 illustrates another embodiment of rail of a mounting kit attached to a rack, according to another embodiment.

As indicated above in conjunction with FIGS. 1A-1C, the mounting kit may include a rail 110 and a rail 112, e.g. of metal, that are connectable (e.g., attachable) to frame 104, and thus rack 102. Rail 110 may extend from front column $106_1$ to back column $106_2$ and may be connected (e.g., attached) to front column $106_1$ and to back column $106_2$ at one side of frame 104 of rack 102, such as side 115, e.g., the left side, of frame 104, as shown in FIGS. 2 and 3. Rail 112 may extend from front column $106_3$ to back column $106_4$ and may be connected (e.g., attached) to front column $106_3$ and to back column $106_4$ at the other side frame 104 of rack 102, such as side 116, e.g., the right side, of frame 104, as shown in FIGS. 2 and 4. The terms left and right are used herein as an example and can be interchanged. For some embodiments, rails 110 and 112 may be substantially the same (e.g., the same).

Rail 110 may be connected (e.g., attached) to columns $106_1$ and $106_2$ so that an end 120 of rail 110 is recessed into frame 104, e.g., recessed inward from the front surface 108 of column $106_1$ and thus the front 109 of frame 104 and rack 102, as shown in FIG. 3. Rail 110 may be connected (e.g., attached) to inner surfaces of columns $106_1$ and $106_2$ using fasteners, such as screws 210 and nuts 222, e.g., cage nuts, where screws 210 and nuts 222 may be included in the mounting kit for some embodiments.

Similarly, rail 112 may be connected (e.g., attached) to columns $106_3$ and $106_4$ so that an end 125 of rail 112 is recessed into frame 104, e.g., recessed inward from the front surface 108 of column $106_3$ and thus the front 109 of frame 104 and rack 102, as shown in FIG. 4. Rail 112 may be connected (e.g., attached) to inner surfaces of columns $106_3$ and $106_4$ using fasteners, such as screws 210 and nuts 222 (not shown in FIG. 4).

For some embodiments where rails 110 and 112 are substantially the same (e.g., the same), the rail 112 may be rotated by substantially 180 degrees (e.g., by 180 degrees) with respect to rail 110 (when rail 110 is connected to frame 104) so that end 120 of rail 110 and end 125 of rail 112 are adjacent to the front 109 of frame 104 and end 125 of rail 110 and end 120 of rail 112 are adjacent to the back 117 of frame 104, as shown in FIGS. 3 and 4.

Rails 110 and 112 may include codes that denote the sides of the frame 104, and thus rack 102, to which the rails 110 and 112 are to be connected. For example, rails 110 and 112 may each include a code denoting side 115 of frame 104 on which columns $106_1$ and $106_2$ are located, such as a code L (e.g., denoting the left side of frame 104), and a code denoting side 116 of frame 109 on which columns $106_3$ and $106_4$ are located, such as a code R (e.g., denoting the right side of frame 104).

Code L may correspond to a pair of openings (e.g., holes) 220 passing through each of rails 110 and 112 for receiving the fasteners, such as screws 210, that connect rail 110 to side 115, denoted by the code L, and code R may correspond to a pair of openings (e.g., holes) 225 passing through each of rails 110 and 112 for receiving the fasteners, such as screws 210, that connect rail 112 to side 116, denoted by the code R.

A code R may be located adjacent to each of openings 225 on an interior surface of each rails 110 and 112 that faces switch 111 (e.g., that faces the interior of frame 109, and thus rack 102), as shown in FIGS. 3 and 4. A code L may be located adjacent to each of openings 220 on the interior surface of each of rails 110 and 112, as shown in FIGS. 3 and 4. That is, codes L and R may be located on interior surfaces of portions (e.g., sidewalls) 310 and 410 respectively of rails 110 and 112.

To connect rail 110 to side 115 of frame 104 (FIG. 3), the L-coded openings 220 may be respectively aligned with openings 230 (e.g., in which a nut 222 may be located) respectively in columns $106_1$ and $106_2$, and the screws 210 may be passed through the respective L-coded openings 220 and threaded into the nuts 222 in the openings 230 within the respective columns $106_1$ and $106_2$. To connect rail 112 to side 116 of frame 104 (FIG. 4), rail 112 may be rotated by substantially 180 degrees relative to rail 110 (when rail 110 is connected to frame 104), and the R-coded openings 225 may be respectively aligned with openings 230 (e.g., in which a nut 222 may be located) respectively in columns $106_3$ and $106_4$. Screws 210 may then be passed through the respective R-coded openings 225 and threaded into the nuts 222 in the openings 230 within the respective columns $106_3$ and $106_4$.

The codes may be thought of as corresponding to locations on rails 110 and 112 to be directly attached to the columns 106 located on the sides of frame 104 that are respectively denoted by the codes. For example, the L code may correspond to locations on rail 110 that are to be respectively directly attached to columns $106_1$ and $106_2$ on the side (side 115 (e.g., the left side)), of frame 104 denoted the L code, e.g., by screws 210 and nuts 222, and the R code may correspond to locations on rail 112 that are to be respectively directly attached to columns $106_3$ and $106_4$ on the side (side 116 (e.g., the right side)), of frame 104 denoted the R code, e.g., by screws 210 and nuts 222.

Stated in another way, the L code may correspond to the openings 220 to be used when connecting (e.g., attaching) rail 110 to the side (side 115) of frame 104 denoted by the L code, and the R code may correspond to the openings 225 to be used when connecting (e.g., attaching) rail 112 to the side (side 116) of frame 104 denoted by the R code. For example, the L code corresponds to the pair openings 220 in rails 110 and 112 that is to be used when connecting rail 110 or rail 112 to the left side frame 104, and the R code corresponds to the pair openings 225 in rails 110 and 112 that is to be used when connecting rail 110 or rail 112 to the right side frame 104.

Figure 5:
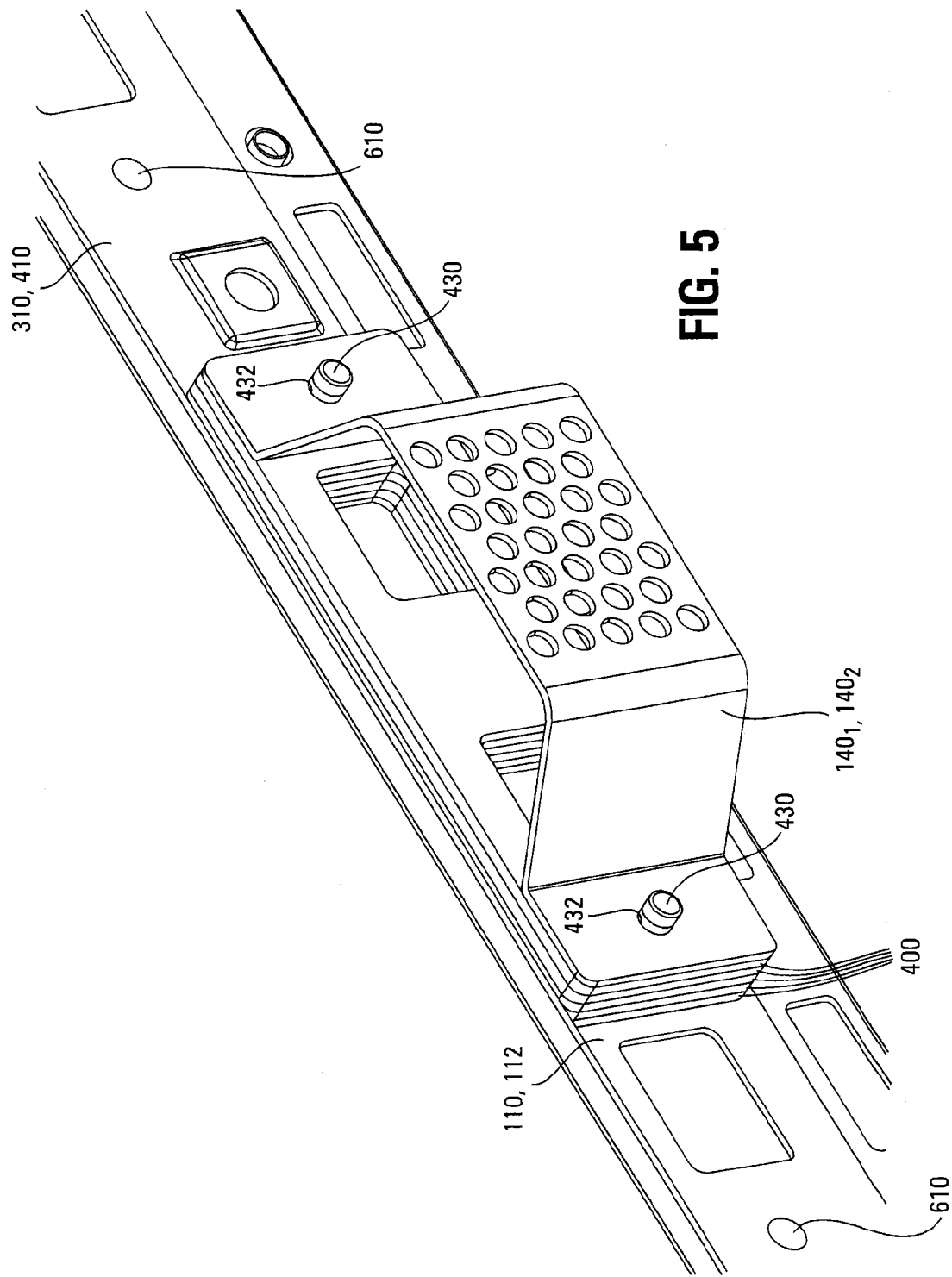
FIG. 5 illustrates an embodiment of spacer of a mounting kit connected to a rail of the mounting kit, according to another embodiment.
Figure 6:
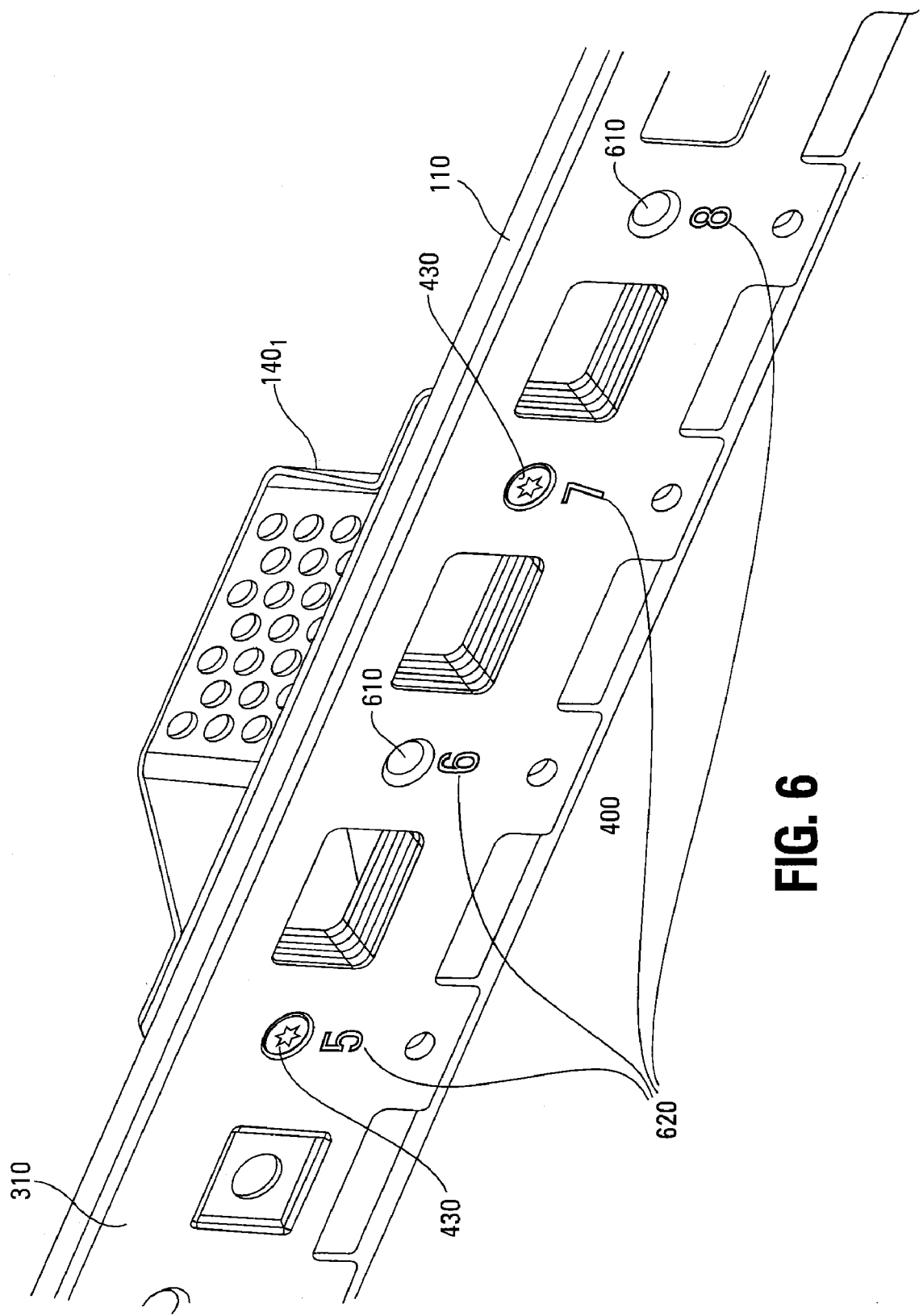
FIG. 6 illustrates location code numbers on a rail of a mounting kit, according to another embodiment.
Figure 7:
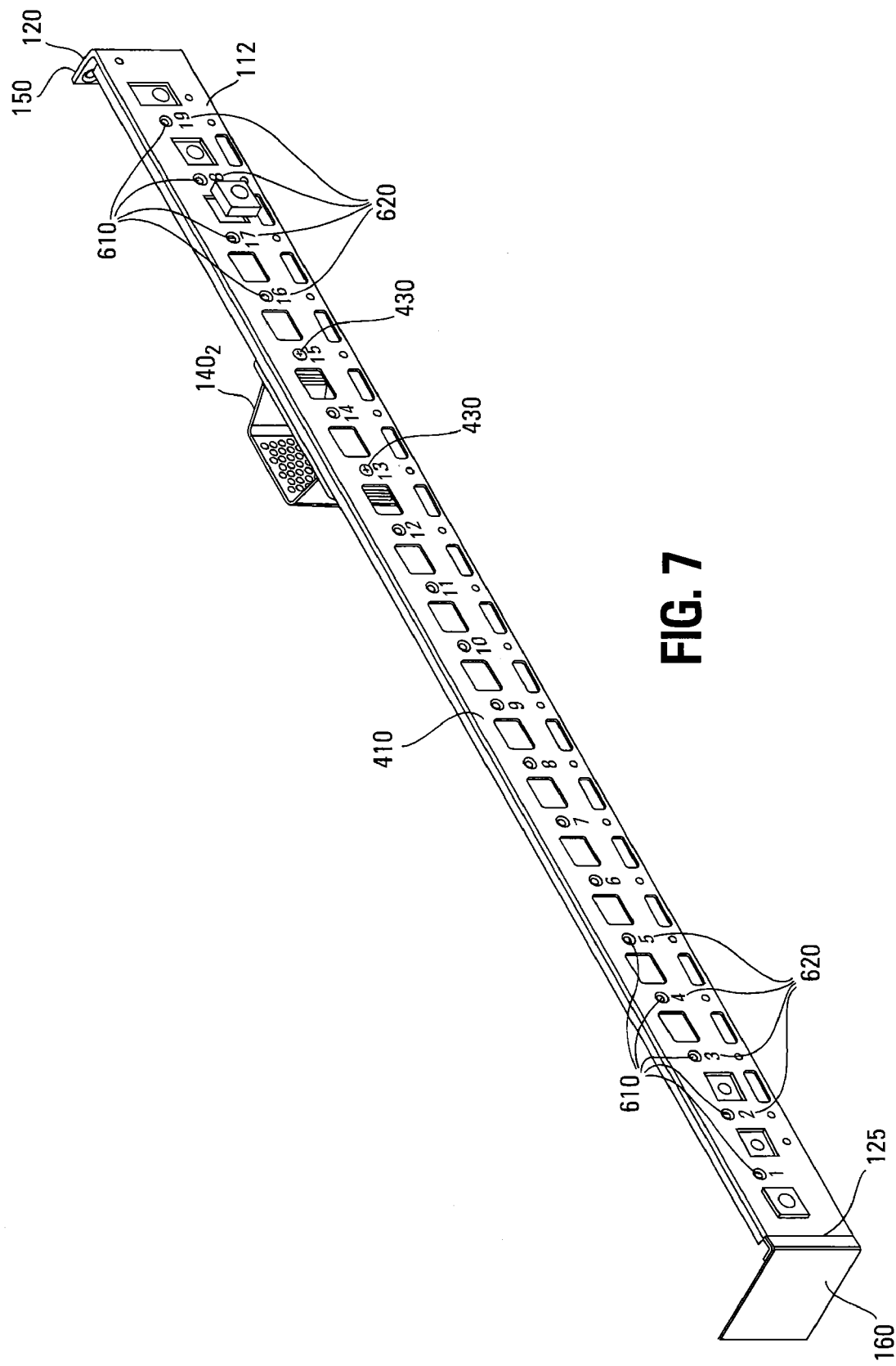
FIG. 7 illustrates an embodiment of a tab connected to a rail of a mounting kit, according to another embodiment.

The mounting kit may also include spacers $140_1$ and $140_2$ (e.g., of metal) respectively connectable to rails 110 and 112, as shown in FIGS. 2 and 5, FIG. 6 for rail 110, and FIG. 7 for rail 112. Spacers $140_1$ and $140_2$ are configured to engage switch 111 therebetween when rails 110 and 112 are connected to frame 104 (FIGS. 1C and 2). For example, spacers $140_1$ and $140_2$ are configured to extend inward from sidewalls 310 and 410 respectively of rails 110 and 112 to respectively engage (e.g., directly contact) opposing sidewalls 710 of switch 111 when rails 110 and 112 are connected to frame 104 and when switch 111 is located between rails 110 and 112.

Figure 8:
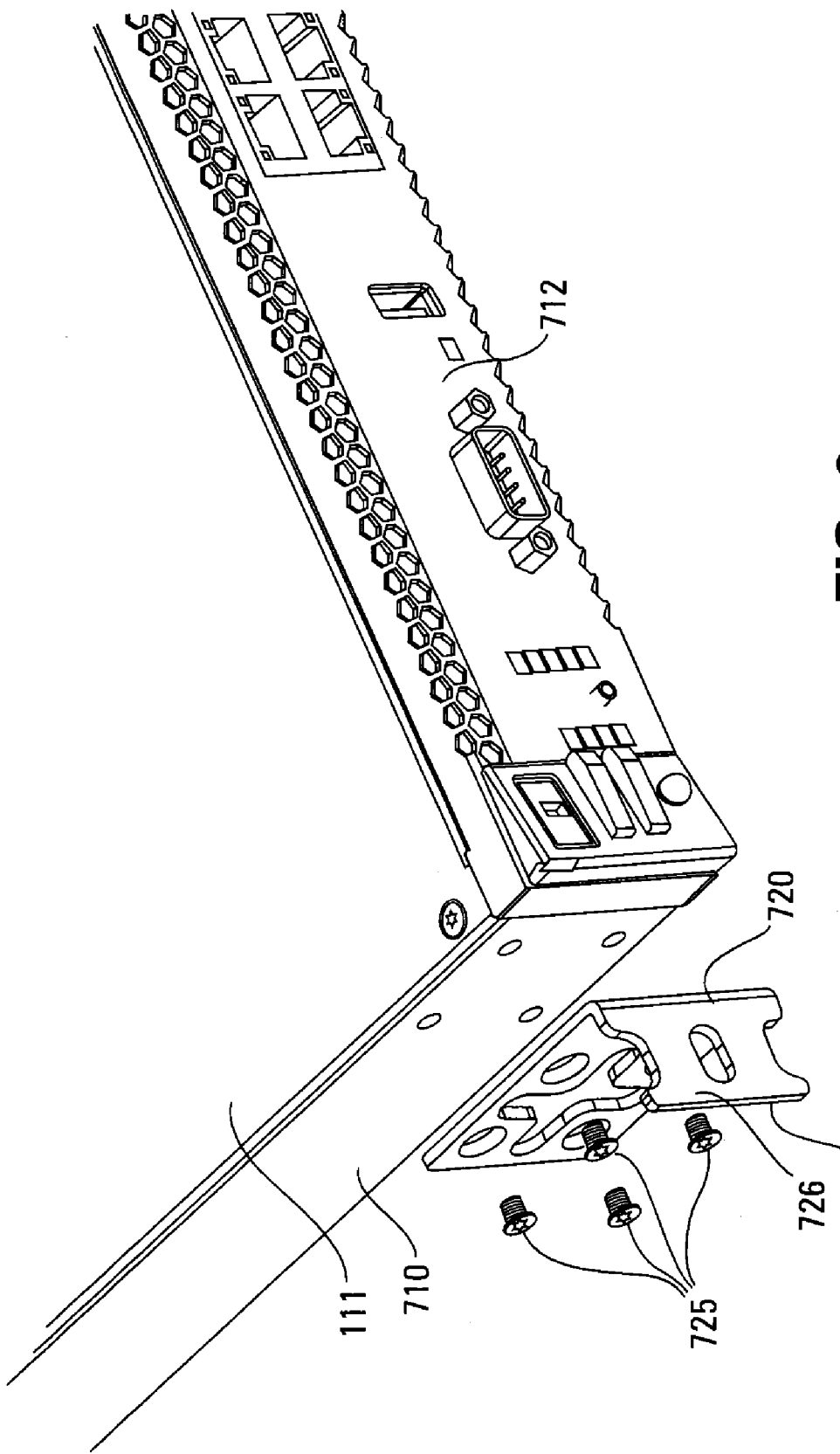
FIG. 8 illustrates an electronic component of the prior art.

A connector 720 (e.g., that may be provided with switch 111) may be connected, e.g., attached, to only one sidewall 710 of switch 111, e.g., using fasteners, such as screws 725, as shown in FIG. 8, so that a tab 726 of connector 720 extends from the sidewall 710, e.g. adjacent to (e.g., substantially flush with) a front surface (e.g. front) 712 of switch 111.

Connector 720 may be one of two or more connectors that may be provided with switch 111. For example, in the prior art, such connectors may be attached to each of opposing sidewalls 710 of switch 111 so that a tab thereof extends from each of the opposing sidewalls 710. In the prior art, each of the tabs, and thus each connector, may attach directly to the front surfaces 108 respectively of columns $106_1$ and $106_3$ (FIG. 2) so that the front surface 712 of switch 111 lies substantially in the plane corresponding to the front 109 of rack 102, e.g., providing little clearance for any cables to be routed between the front of the switch and a door of an enclosure.

As such, for some embodiments, connector 720 may be one of two or more connectors provided with switch 111 having tabs 726 that are originally configured to attach directly to the front surfaces 108 respectively of front columns $106_1$ and $106_3$, and thus to the front 109 of frame 104, for attaching switch 111 to the front 109 of frame 104.

For some embodiments, one or both of rails 110 and 112 may include a tab 150. For example, for embodiments where rails 110 and 112 may be substantially the same, a tab 150 may form an end 120 of each of rails 110 and 112, as shown in FIGS. 3, 7, and 9 (also see FIGS. 2 and 4).

Tab 150 may respectively extend from and may be respectively substantially perpendicular to (e.g., perpendicular to) portions 310 and 410 respectively of rails 110 and 112, as shown in FIGS. 3, 4, and 7. The tab 150 of rail 110 may extend inward from portion 310 of rail 110 toward the interior of frame 109, e.g., toward switch 111 and rail 112, as shown in FIGS. 3 and 9. For embodiments where rails 110 and 112 are substantially the same, rail 112 may be rotated by substantially 180 degrees so that its tab 150 may extend inward from portion 410 of rail 112 toward the interior of frame 109, e.g., toward switch 111 and rail 110, as shown in FIG. 2.

There may be only one connector 720 connected to switch 111 that is originally configured to be attached to the front 109 of frame 104, e.g., to the front surfaces 108 of front columns $106_1$ and $106_3$. For some embodiments, tab 150 is directly attachable to the tab 726 of the one connector 720 after rail 110 is connected to columns $106_1$ and $106_2$ of frame 104 of rack 102. For example, after rail 110 is connected to columns $106_1$ and $106_2$ of frame 104 of rack 102, the tab 726 of the one connector 720 may be attached directly to the tab 150, and thus to end 120, of rail 110, e.g., using fasteners, such as screws 800, as shown in FIG. 9. For other embodiments, only one connector 720, e.g., originally configured to be attached to the front surface (e.g., front surface 108) of frame 104, may be connected to switch 111 when connector 720 is attached to the end 120, and thus tab 150, of rail 110.

Figure 9:
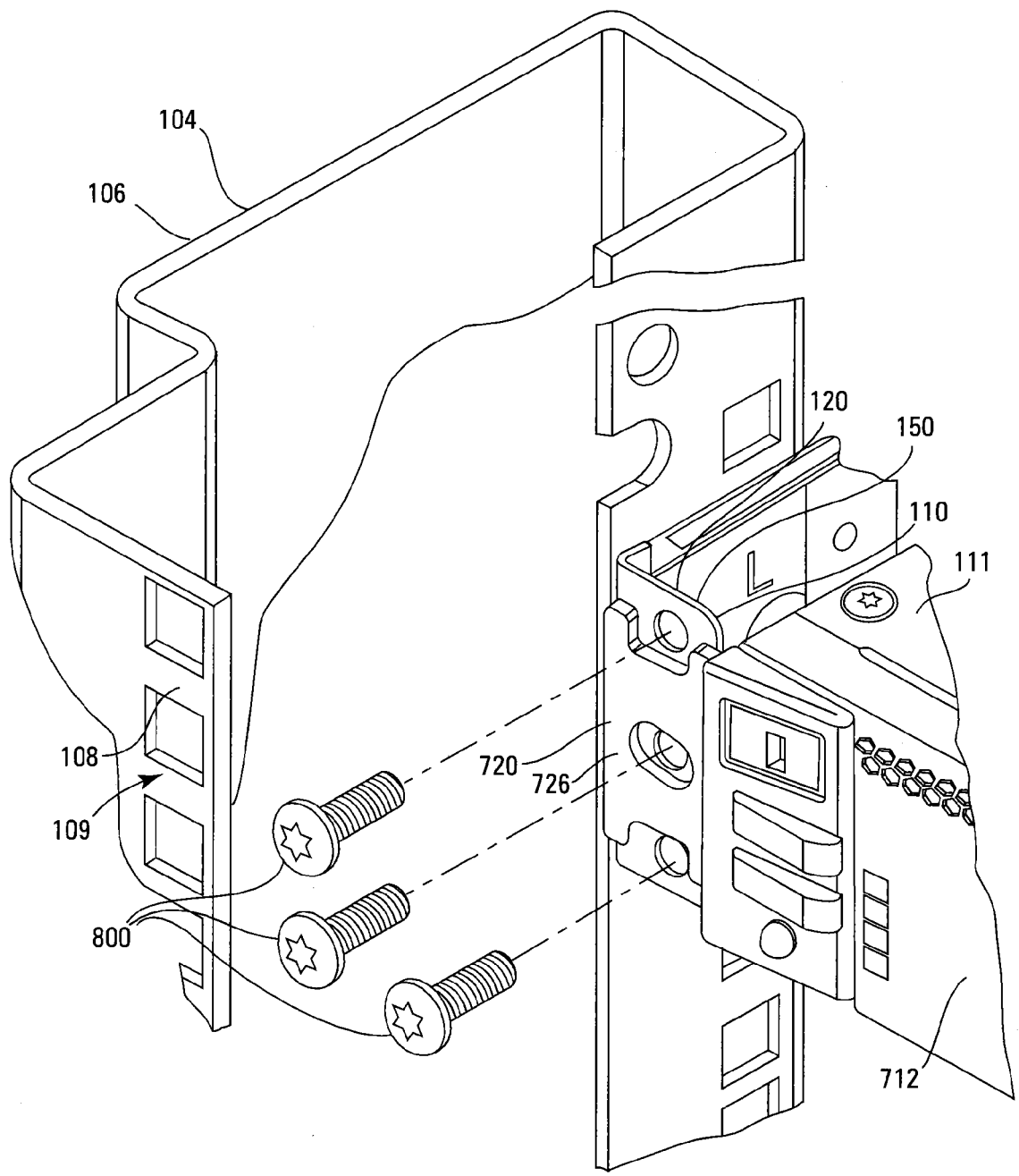
FIG. 9 illustrates an embodiment of a rail of a mounting kit being connected to an object, according to another embodiment.

Since end 120 is recessed inward (back) from the front 109 of frame 104, attaching the tab 726 of the one connector 720 to end 120 recesses the front 712 of switch 111 inward (back) from the front 109 of frame 104, and thus rack 102, as shown in FIGS. 2, 3, and 9, to form a recess 152 (FIG. 2) between the front 109 and the front 712 of switch 111. Recess 152 advantageously allows cables that may be coupled to the front of switch 111 to be routed through the recess 152, e.g., between the front surface 712 of switch 111 and a door of an enclosure (not shown) that may enclose frame 104, and thus rack 102.

The mounting kit may further include one or more shims 400, e.g., of plastic, metal, etc., locatable between spacer $140_1$ and rail 110 and between spacer $140_2$ and rail 112, as shown in FIG. 5. For example, one or more shims 400 may be located between the portion (e.g., sidewall) 310 of rail 110 and spacer $140_1$ and between the portion (e.g., sidewall) 410 of rail 112 and spacer $140_2$, as shown in FIG. 5.

The mounting kit may further include a look-up table, such as Table 1, for determining a number of shims 400 to be located between spacer $140_1$ and portion 310 of rail 110 based on a width of switch 111 and for determining a number of shims 400 to be located between spacer $140_2$ and portion 410 of rail 112 based on the width of switch 111. For example, the width of switch 111 may be defined as a distance between opposing sidewalls 710 (e.g., the distance from one sidewall 710 to the other sidewall 710) of switch 111 that respectively face portions 310 and 410 of rails 110 and 112 (FIG. 2).

TABLE 1

| Width of Switch (mm) | Number of Shims Between a Spacer and a Rail |
|---|---|
| 444.0 to 447.0 | 0 |
| 441.0 to 443.9 | 1 |
| 438.0 to 440.0 | 2 |
| 435.0 to 437.9 | 3 |
| 432.0 to 434.9 | 4 |
| 429.0 to 431.9 | 5 |

Table 1 presents a number of shims versus ranges of widths of switch 111. To use Table 1, the width of switch 111 is measured. The measured width is input to Table 1, e.g., Table 1 is entered with the measured width, and the number of shims corresponding to the measured width is output (e.g., obtained) from Table 1.

Each of rails 110 and 112 may include a plurality of openings 610, such as holes, that pass through portions 310 and 410 respectively of rails 110 and 112, as shown in FIGS. 3-7. The locations of openings 610 on the respective rails 110 and 112 may be identified with location code numbers 620, as shown in FIGS. 2, 6, and 7. The location code numbers 620 may be located on exterior surfaces of portions 310 and 410 respectively of rails 110 and 112 adjacent to their respective openings 610, as shown in FIGS. 2, 6, and 7, e.g., on surfaces of portions 310 and 410 that face away from the interior of frame 104, and thus the interior of rack 102, and thus away from switch 111.

The location code numbers 620 may form a sequence of numbers (e.g., integers) that ascend sequentially in numerical order from end 125 toward end 120 of the respective rails 110 and 112, as shown in FIG. 7 for rail 112. This means that for other embodiments, where rail 112 is rotated by substantially 180 degrees relative to rail 110, the location code numbers 620 of the sequence on rail 112 ascend sequentially in numerical order from the front 109 of frame 104 toward the back 117 of frame 104, and the location code numbers 620 of the sequence on rail 110 descend sequentially in reverse numerical order from the front 109 of frame 104 toward the back 117 of frame 104.

The location code numbers 620 of the sequence on rail 110 correspond one-to-one with the openings 610 through rail 110, with the opening 610 closest to the front 109 of frame 104 being the highest number in the sequence, e.g., 19, and the opening 610 furthest from the front 109 of frame 104 (e.g., closest to the back 117 of frame 104) being the lowest number in the sequence, e.g., 1. The location code numbers 620 of the sequence on rail 112 correspond one-to-one with the openings 610 in rail 112, with the opening 610 closest to the front 109 of frame 104 being the lowest number in the sequence, e.g., 1, and the opening 610 furthest from the front 109 of frame 104 (e.g., closest to the back 117 of frame 104) being the highest number in the sequence, e.g., 19.

The locations of the openings 610 in rail 112 corresponding to the location code numbers 620 in the sequence on rail 112, ascending from the front to the back of the frame, may be respectively opposite to the locations of the openings 610 in rail 110 corresponding to the location code numbers 620 in the sequence on rail 110, descending from the front to the back of the frame. For example, the locations of openings 610 on rail 112 respectively corresponding to the numbers 1-19 of the location code numbers 620 on rail 112 may be respectively substantially directly opposite to (e.g., substantially directly across the width of switch 111 from) the locations of openings 610 on rail 110 respectively corresponding to the numbers 19-1 of location code numbers 620 on rail 110. Stated in another way, the locations of openings 610 on rail 112 that respectively correspond to the numbers 1-19 on rail 112 are respectively at substantially the same distances from end 125 of rail 112 (FIG. 4), and thus from the front 109 of frame 104, as the distances of the locations of openings 610 on rail 110 respectively corresponding to the numbers 19-1 on rail 110 are from end 120 of rail 110 (FIG. 3), and thus from the front 109 of frame 104.

A pair of fasteners 430, such as screws, may pass through a pair of openings 610 and though any shims 400 that may be present and may thread into a pair threaded openings 432 in each of spacers 140$_1$ and 140$_2$, as shown in FIGS. 5-7. A center-to-center distance between the threaded openings 432 in a spacer 140 may span a distance that is substantially twice (e.g., twice) the center-to-center distance between successively adjacent openings 610. For example, the center-to-center distance between the threaded openings 432 may be substantially equal to the distance between the openings 610 corresponding to numbers 5 and 7 in rail 110 in FIG. 6 and between the openings 610 corresponding to numbers 13 and 15 rail 112 in FIG. 7. This means that there is an opening 610 interposed between the openings the 610 that receive fasteners 430 when connecting a spacer to a rail.

For example, the openings 610 that receive fasteners 410 correspond to the numbers 5 and 7 in FIG. 6, where the opening 610 between the openings 610 corresponding to the numbers 5 and 7 and corresponding to the number 6 does not receive a fastener 430. Similarly, for example, the openings 610 that receive fasteners 410 correspond to the numbers 13 and 15 in FIG. 7, where the opening 610 between the openings 610 corresponding to the numbers 13 and 15 and corresponding to number 14 does not receive a fastener 430.

The mounting kit may further include a look-up table, e.g., Table 2, for determining a location on rail 110 to which spacer 140$_1$ is to be attached based on a distance D and determining a location on rail 112 to which spacer 140$_2$ is to be attached based on the distance D, e.g., where the distance D is the distance from a rear-facing exterior surface 727 of tab 726 of connector 720 (FIGS. 1B and 8) to a back surface (e.g., back) 730 of switch 111, as shown in FIG. 1B. Note that the distance D may be substantially the length of switch 111.

TABLE 2

| Distance D (mm) | Spacer Opening Location Codes Rail 110 | Spacer Opening Location Codes Rail 112 |
| --- | --- | --- |
| 110.3 to 141.2 | 16 and 18 | 2 and 4 |
| 141.2 to 172.2 | 15 and 17 | 3 and 5 |
| 172.2 to 203.1 | 14 and 16 | 4 and 6 |
| 203.1 to 234.1 | 13 and 15 | 5 and 7 |
| 234.1 to 265.0 | 12 and 14 | 6 and 8 |
| 265.0 to 296.0 | 11 and 13 | 7 and 9 |
| 296.0 to 326.9 | 10 and 12 | 8 and 10 |
| 326.9 to 357.9 | 9 and 11 | 9 and 11 |
| 357.9 to 388.8 | 8 and 10 | 10 and 12 |
| 388.8 to 419.8 | 7 and 9 | 11 and 13 |
| 419.8 to 450.7 | 6 and 8 | 12 and 14 |
| 450.7 to 481.7 | 5 and 7 | 13 and 15 |
| 481.7 to 512.6 | 4 and 6 | 14 and 16 |
| 512.6 to 543.6 | 3 and 5 | 15 and 17 |
| 534.6 to 574.5 | 2 and 4 | 16 and 18 |
| 574.5 to 605.5 | 1 and 3 | 17 and 19 |

Table 2 presents the spacer opening location code numbers for rails 110 and 112 versus the distance D, e.g., ranges of distances D. To use Table 2, the distance D is measured. The measured distance D is input to Table 2, e.g., Table 2 is entered with the measured distance D, and the location code numbers corresponding to the locations of the openings 610 on rails 110 and 112 are output (e.g., obtained) from Table 2. For example, a pair of location code numbers corresponding to the locations of the pair openings 610 on rail 110 that will align with the openings 432 (FIG. 5) in spacer 140$_1$ and a pair of location code numbers corresponding to the locations of the pair openings 610 on rail 112 that will align with the openings 432 in spacer 140$_2$ will be obtained for a distance D.

The locations of the openings 610 in rail 110 respectively corresponding to the left and right location code numbers in Table 2 for rail 110 for a distance D may be respectively substantially directly opposite the locations of the openings 610 in rail 112 respectively corresponding to the right and left location code numbers in Table 2 for rail 112 for that distance D. For example, the locations of the openings 610 in rail 110 respectively corresponding to numbers 5 and 7 (FIGS. 2 and 7) of the code numbers of rail 110 may be respectively substantially directly opposite the locations of the openings 610 in rail 112 respectively corresponding to numbers 15 and 13 (FIGS. 2 and 7) of the code numbers of rail 112. This means that when spacer 140$_1$ is attached to portion 310 of rail 110 using openings 5 and 7 and spacer 140$_2$ is attached to portion 410 of rail 112 using openings 15 and 13, spacers 140$_1$ and 140$_2$ will be substantially directly opposite, e.g. substantially aligned with, each other (e.g., substantially directly across the width of switch 111 from each other) and extending inward toward each other from portions 310 and 410 when rails 110 and 112 are connected to frame 104.

Table 2 provides the locations of spacers 140$_1$ and 140$_2$ respectively on rails 110 and 112 based on the distance D, in that the openings 432 (FIG. 5) in each of spacers 140$_1$ and 140$_2$ will be substantially aligned with the openings 610 corresponding to the location code numbers provided by Table 2. That is, Table 2 facilitates the alignment of spacers 140$_1$ and 140$_2$ with each other.

By providing the locations of spacers $140_1$ and $140_2$ respectively on rails 110 and 112, Table 2 provides the distance from spacer $140_1$ to end 120 (e.g., the front) of rail 110 and the distance from spacer $140_2$ to end 125 (e.g., the front) of rail 112 based on the distance D. Since the distance D may ultimately depend on the length of switch 111, for some embodiments, the distance from spacer $140_1$ to end 120 of rail 110 and the distance from spacer $140_2$ to end 125 of rail 112 may be based on the length of switch 111.

For other embodiments, rail 110 may a include portion (e.g., a ledge, such as a shelf) 312, and rail 112 may include portion (e.g., a ledge, such as a shelf) 412, as shown in FIGS. 1B, 3, and 4. For example, portions 312 and 412 may be locatable under switch 111 when the switch is between rails 110 and 112, e.g., between portions 310 and 410 respectively of rails 110 and 112. Portions 312 and 412 may be respectively substantially perpendicular to (e.g., perpendicular to) portions 310 and 410. Switch 111 may be located on portions 312 and 412 when switch 111 is located between portions 310 and 410 so that portions 312 and 412 can provide vertical support for switch 111.

A tab 160, such as a flap, (e.g., that may be called an air dam) may be connectable (e.g., attachable) to end 125 of the rail, e.g., rail 112, that is not to be attached to connector 720, as shown in FIGS. 2, 4, and 7. For example, tab 160 may be attached to and extend from portion 410 of rail 112, e.g., so that tab 160 is substantially perpendicular to portion 410 of rail 112, as shown in FIGS. 4 and 7. Tab 160 may be configured to extend from portion 410 of rail 112 to a sidewall 710 of switch 111, e.g., so as to contact the sidewall 710, to cover an opening between portion 410 of rail 112 and the sidewall 710, as shown in FIG. 2. Note that tabs 150 and 160 may form opposing ends of rail 112 for some embodiments.

For some embodiments, tab 160 may advantageously act to substantially prevent (e.g., prevent) airflow (e.g., relatively warm airflow) between portion 410 of rail 112 and a sidewall 710 of switch 111 from reaching the front 109 of rack 102. Similarly, the tab 150 of rail 110 (FIG. 3), e.g., fastened to connector 720 (FIG. 9), may advantageously act to substantially prevent (e.g., prevent) airflow (e.g., relatively warm airflow) between portion 310 of rail 110 and an opposite sidewall 710 of switch 111 from reaching the front 109 of rack 102.

Tab 160 may be made from a flexible, resilient material, e.g., flexible, resilient plastic, such as polyester (e.g., MYLAR®), and may be attached to end 125 of rail 112 using adhesive. For example, tab 160 may include an exposable self adhesive that is exposed for adhering tab 160 to end 125 of rail 112.

For some embodiments, tab 160 may be deflected by switch 111 when switch is inserted into rack 102, causing tab 160 to bend as shown in FIG. 2. The resiliency of tab 160 may then bias a portion of tab 160 against (e.g., into direct contact with) the sidewall 710 of switch 111, as shown in FIG. 2.

For some embodiments, spacers $140_1$ and $140_2$ are configured to engage switch 111 therebetween when rails 110 and 112 are connected to frame 104 and when switch 111 is positioned on portions 312 and 412 of rails 110 and 112. For example, spacers $140_1$ and $140_2$ may be located closer to the back 730 of switch 111 than to the front 712 of switch 111, as shown in FIG. 2. Using Table 2 facilitates this placement of spacers $140_1$ and $140_2$. Locating spacers $140_1$ and $140_2$ in this way facilitates the insertion of switch 111 into frame 104, and thus rack 102.

As best seen in FIG. 1B, switch 111 is inserted into frame 104 of rack 102 through the front 109 of frame 104 and is positioned on (e.g., atop) portions 312 and 412 respectively of rails 110 and 112. Switch 111 is moved into frame 104 until the tab 726 of the connector 720, extending from the sidewall 710 of switch 111, reaches the front 109, e.g., the surface 108 of column $106_1$. When connector 720 reaches the surface 108 of column $106_1$, switch 111 is moved away from column $106_1$ in the direction of arrow 910, e.g., switch is rotated away from column $106_1$ in the direction of arrow 920, so that the tab 726 of connector 720 clears column $106_1$ and thus the front 109.

After connector 720 clears column $106_1$, switch 111 may be moved in a direction substantially opposite to the direction of arrow 910, e.g., rotated in a direction substantially opposite to the direction of arrow 920, so as to be substantially parallel with rails 110 and 112, and is moved, e.g., over portions 312 and 412 of rails 110 and 112, toward the back 117 of rack 102 so that switch 111 passes between spacers $140_1$ and $140_2$. With switch 111 between spacers 140, switch is moved until tab 726 of connector 720 contacts tab 150 of rail 110, as shown in FIG. 9, at which point the front 712 of switch 111 is recessed inward from the front 109 of rack 102, as shown in FIG. 2. Connector may then be fastened to tab 150 of rail 110, e.g., using fasteners 800, as shown in FIG. 9.

The position of spacers $140_1$ and $140_2$, e.g., provided by Table 2, advantageously allows switch 111 to be rotated away from column $106_1$ to provide clearance between column $106_1$ and connector 720. That is, if spacers $140_1$ and $140_2$ are too close to the front 109 of rack 102, switch 111 would engage spacers $140_1$ and $140_2$ before connector 720 reaches the surface 108 of column $106_1$, e.g., thereby substantially preventing switch 111 from being rotated and thus substantially preventing connector 720 from clearing column $106_1$. For example, this would substantially prevent switch 111 from being inserted into rack 102. Note that using Table 2 also advantageously facilitates the positioning of spacers $140_1$ and $140_2$ so that they are aligned with each other and respectively engage the sidewalls 710 of switch 111 when switch 111 is recessed within rack 102, as shown in FIG. 2.

Attaching only one connector 720 to switch 111, e.g., that is originally configured to attach to the front surface 108 of one of the front columns $106_1$ or $106_3$ of frame 104, and thus the front 109 of frame 104, advantageously allows that connector 720 to clear frame 104, e.g., by rotating switch 111, as shown in FIG. 1B. Allowing connector 720 to clear frame 104 in this way advantageously allows switch 111 to be inserted into rack 102. For example, attaching a connector 720 to both sidewalls 720, as is sometimes done in the prior art, would act to substantially prevent one, or both, of the connectors 720 from clearing rack 102, thus substantially preventing switch 111 from being inserted into frame 104.

Spacers 140 act to substantially prevent (e.g., to prevent) switch 111 from moving from side to side within rack 102 and act, at least partially, to compensate for using only one connector 720 to connect (e.g., attach) switch 111 to rail 110 and thus frame 104 of rack 102. Portions 312 and 412 respectively of rails 110 and 112 act to substantially prevent (e.g., to prevent) switch 111 from moving vertically downward within rack 102 and act, at least partially, to compensate for using only one connector 720 to connect switch 111 to rail 110 and thus frame 104 of rack 102. Connector 720 acts to substantially prevent (e.g., to prevent) switch 111 from moving from front to back with in rack 102.

For some embodiments, the mounting kit may include a tie (e.g. a tie-down) 180 that may be used to substantially prevent (e.g., to prevent) switch 111 from moving vertically upward, e.g., during shipping of rack 102 with switch 111 contained therein, as shown in FIG. 2. Tie 180 may be connectable (e.g., attachable) to rails 110 and 112 and may be metal, a flexible fabric, a resilient material, such as elastic or rubber, etc. For one embodiment, tie 180 may include hook-and-loop material. Tie 180 may be being configured to bear against an upper surface of switch 111 when switch 111 is between rails 110 and 112. For other embodiments, tie 180 may loop through openings 185 in rails 110 and 112, as shown in FIG. 2.

Figure 10:
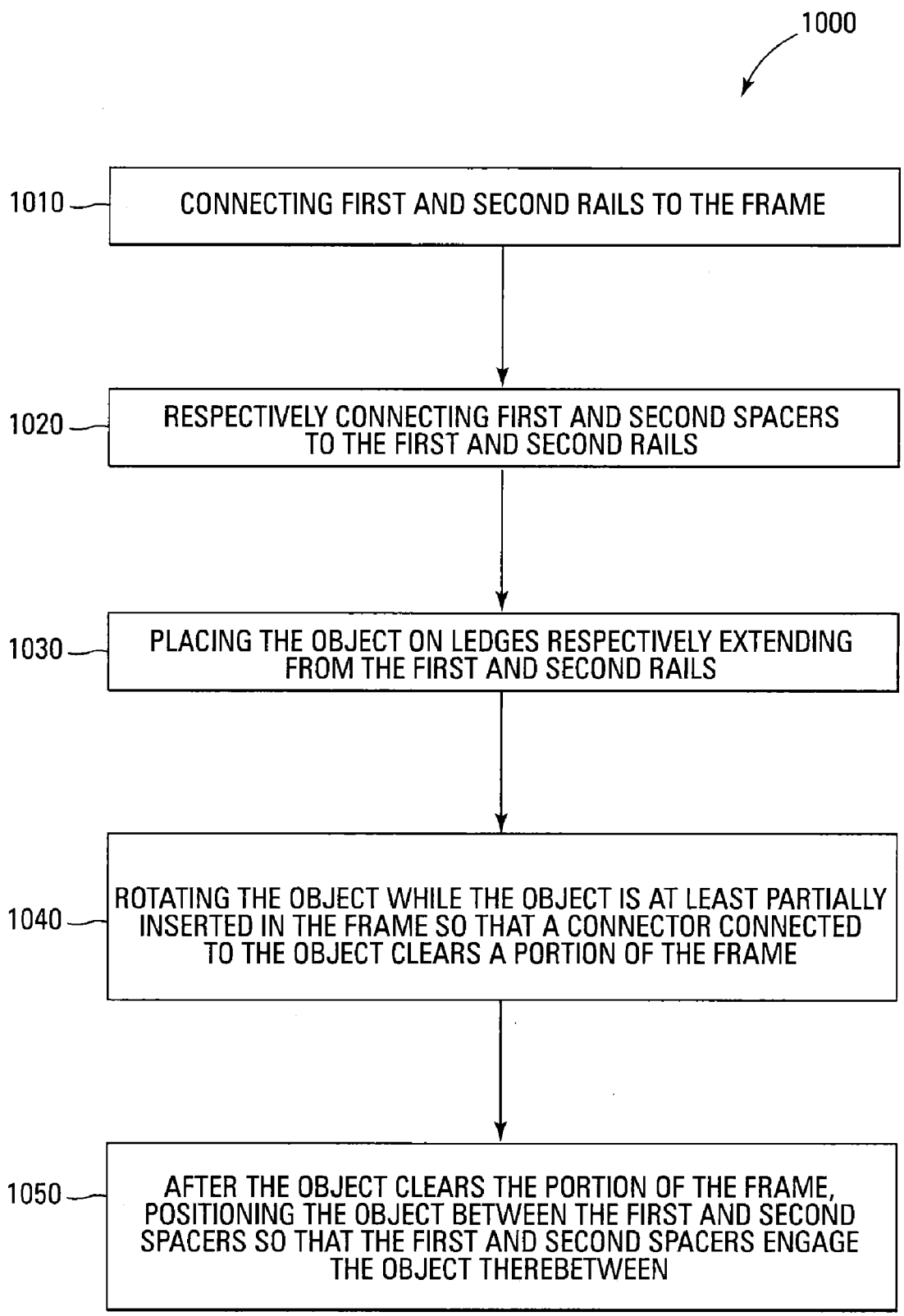
FIG. 10 is a flowchart of an embodiment of a method of mounting an object within a frame, according to another embodiment.

FIG. 10 is flowchart of an example method 1000 of mounting an object, e.g., an electronic component, such as switch 111, within the frame, such as frame 104 of rack 102. Method 1000 may include connecting first and second rails, such as rails 100 and 112, to the frame, at block 1010; respectively connecting first and second spacers, such as spacers $140_1$ and $140_2$, to the first and second rails, at block 1020; placing the object on ledges, e.g., ledges 312 and 412, respectively extending from the first and second rails, at block 1030; rotating the object while the object is at least partially inserted in the frame so that a connector connected to the object clears a portion of the frame, at block 1040; and after the object clears the portion of the frame, positioning the object between the first and second spacers so that the first and second spacers engage the object therebetween, at block 1050.

Method 1000 may further include using a look-up table, such as Table 1, to determine a number of shims, such as shims 400, to be positioned between the first rail and the first spacer and between the second rail and the second spacer before respectively connecting first and second spacers to the first portions of the first and second rails. Method 1000 may also include entering that look-up table with a width of the switch to determine the number of shims to be positioned between the first rail and the first spacer and between the second rail and the second spacer for the width of the switch.

The first and second rails may each comprise a first code, such as the L code, and a second code, such as the R code, respectively denoting a first side, such as side 115, e.g., the left side, of the frame and a second side, such as side 116, e.g., the right side, of the frame. Connecting the first and second rails to the frame may include receiving fasteners, such as screws 210, in first openings, such as openings 220, in the first rail or the second rail, corresponding to the first code to connect either the first or the second rail to the first side of the frame and receiving fasteners, such as screws 210, in second openings, such as openings 225, in the first rail or the second rail, corresponding to the second code to connect either the first or the second rail to the second side of the frame.

Method 1000 may further include using a look-up table, Table 2, to determine locations on the first and second rails at which the first and second spacers are to be respectively connected before respectively connecting first and second spacers to the first and second rails. Method 1000 may also include entering that look-up table with a distance from a connector, such as connector 720, connected to the object, to a front, such as front 712, of the object to determine the locations on the first and second rails to which the first and second spacers are to be respectively connected for that distance.

In method 1000, respectively connecting the first and second spacers to the first and second rails, may include connecting the first spacer to the first rail at a distance from an end of the first rail based on a length of the object and connecting the second spacer to the second rail at a distance from an end of the second rail based on the length of the object. Connecting a tab, e.g., tab 160, to the second rail so that the tab covers an opening between the object and the second rail may be included in method 1000. Attaching a portion, e.g., tab 150, of the first rail to a connector, e.g., connector 720, connected to the object so that a front of the object, front 712, is recessed inward from a front, front 109, of the frame may be included in method 1000.

Embodiments herein provide mounting kits, e.g., substantially universal mounting kits, for recess mounting objects, such as electronic components, e.g. switches, within racks. Embodiments of the mounting kits may advantageously utilize one of two or more standard connectors, such as connector 720, that may be supplied with a switch, where such standard connectors may be originally configured to be attached to the front of the rack, to recess mount the switch within the rack. Embodiments of the mounting kits advantageously avoid having to use kits that are custom made for each recessed mounting situation.

Although specific embodiments have been illustrated and described herein it is manifestly intended that the scope of the claimed subject matter be limited only by the following claims and equivalents thereof.

What is claimed is:

1. A mounting kit, comprising:
   first and second rails connectable to a frame; and
   first and second spacers respectively connectable to the first and second rails;
   wherein the first and second spacers are configured to engage an object therebetween when the first and second rails are connected to the frame;
   wherein the first and second rails each comprise a portion configured to extend under the object when the object is between the first and second spacers; and
   wherein a distance from the first spacer to an end of the first rail and a distance from the second spacer to an end of the second rail are based on a length of the object.

2. The mounting kit of claim 1, further comprising one or more shims locatable between the first spacer and the first rail and one or more shims locatable between the second spacer and the second rail.

3. The mounting kit of claim 1, further comprising a look-up table for determining a number of shims to be located between the first spacer and the first rail based on a width of the object and for determining a number of shims to be located between the second spacer and the second rail based on the width of the object.

4. The mounting kit of claim 1, further comprising a look-up table for determining a location on the first rail to which the first spacer is to be attached based on a distance from a connector connected to the object to a back of the object and for determining a location on the second rail to which the second spacer is to be attached based on the distance from the connector to the back of the object.

5. The mounting kit of claim 1, further comprising a tie connectable to the first and second rails and configured to extend from the first rail to the second rail, the tie being configured to bear against an upper surface of the object when the object is between the first and second rails.

6. The mounting kit of claim 1, wherein the first rail is connectable to the frame so that an end of the first rail is recessed inward from a front of the frame, and wherein the end of the first rail is configured to be attached to a connector connected to the object so that a front of the object is recessed inward from the front of the frame.

7. The mounting kit of claim 6, wherein the connector was originally configured to be attached to a front surface of the frame and wherein only one such connector is connected to the object when the connector is attached to the end of the first rail.

8. The mounting kit of claim 6, further comprising a tab connectable to an end of the second rail and configured to extend from the second rail to the object.

9. The mounting kit of claim 1, wherein the first and second rails each comprise first and second codes respectively denoting first and second sides of the frame, wherein the first code corresponds to a first pair openings in the first and second rails that is to be used when connecting the first or second rail to the first side of the frame, and wherein the second code corresponds to a second pair openings in the first and second rails that is to be used when connecting the first or second rail to the second side of the frame.

10. A mounting kit, comprising:
a first rail connectable to a first pair of columns of a rack so that an end of the first rail is recessed inward from a front surface of a front column of the first pair of columns, the first rail comprising first and second portions;
a second rail connectable to a second pair of columns of the rack, the second rail comprising first and second portions;
first and second spacers respectively connected to the first portions of first and second rails;
wherein the first and second spacers are configured to respectively extend from the first portions of first and second rails to respectively engage opposing sidewalls of an electrical component when the first and second rails are connected to the rack and when the electrical component is positioned on the second portions of the first and second rails.

11. The mounting kit of claim 10, wherein the end of the first rail is attachable to a connector extending from a sidewall of the electrical component so that a front of the electrical component is recessed inward from the front surface of the front column of the first pair of columns and a front surface of a front column of the second pair of columns.

12. A method of mounting an object within the frame, comprising:
connecting first and second rails to the frame;
respectively connecting first and second spacers to the first and second rails;
placing the object on ledges respectively extending from the first and second rails;
rotating the object while the object is at least partially inserted in the frame so that a connector connected to the object clears a portion of the frame; and
after the object clears the portion of the frame, positioning the object between the first and second spacers so that the first and second spacers engage the object therebetween.

13. The method of claim 12, further comprising using a look-up table to determine a number of shims to be positioned between the first rail and the first spacer and between the second rail and the second spacer before respectively connecting first and second spacers to the first portions of the first and second rails.

14. The method of claim 13, further comprising entering the look-up table with a width of the switch to determine the number of shims to be positioned between the first rail and the first spacer and between the second rail and the second spacer for the width of the switch.

15. The method of claim 12, further comprising using a look-up table to determine locations on the first and second rails to which the first and second spacers are to be respectively connected before respectively connecting first and second spacers to the first and second rails.

16. The method of claim 15, further comprising entering the look-up table with a distance from a connector, connected to the object, to a front of the object to determine the locations on the first and second rails to which the first and second spacers are to be respectively connected for that distance.

17. The method of claim 15, wherein respectively connecting the first and second spacers to the first and second rails, comprises connecting the first spacer to the first rail at a distance from an end of the first rail based on a length of the object and connecting the second spacer to the second rail at a distance from an end of the second rail based on the length of the object.

18. The method of claim 12, further comprising connecting a tab to the second rail so that the tab covers an opening between the object and the second rail.

19. The method of claim 12, further comprising attaching a portion of the first rail to a connector connected to the object so that a front of the object is recessed inward from a front of the frame.

20. The method of claim 12, wherein the first and second rails each comprise a first code and a second code respectively denoting a first side and a second side of the frame, wherein connecting first and second rails to the frame comprises:
receiving fasteners in first openings in the first rail or first openings the second rail, corresponding to the first code, to connect either the first or the second rail to the first side of the frame; and
receiving fasteners in second openings in the first rail or the second rail, corresponding to the second code, to connect either the first or the second rail to the second side of the frame.

* * * * *